US010545181B2

(12) United States Patent
Rolia et al.

(10) Patent No.: US 10,545,181 B2
(45) Date of Patent: Jan. 28, 2020

(54) SYSTEMS AND METHODS FOR APPORTIONING POWER CONSUMPTION (75) Inventors: Jerome Rolia, Kanata (CA); Cullen E. Bash, Los Gatos, CA (US); Daniel J. Gmach, Palo Alto, CA (US); Yuan Chen, Sunnyvale, CA (US); Mustazirul Islam, Rocklin, CA (US); SM Prakash Shiva, Karnataka (IN); Zhikui Wang, Fremont, CA (US)

(73) Assignee: MICRO FOCUS LLC, Santa Clara, CA (US)

( * ) Notice: Subject to any disclaimer, the term of this patent is extended or adjusted under 35 U.S.C. 154(b) by 1763 days.

(21) Appl. No.: 13/812,949

(22) PCT Filed: Aug. 6, 2010

(86) PCT No.: PCT/US2010/044728
§ 371 (c)(1),
(2), (4) Date: Jan. 29, 2013

(87) PCT Pub. No.: WO2012/018347
PCT Pub. Date: Feb. 9, 2012

(65) Prior Publication Data
US 2013/0132009 A1 May 23, 2013

(51) Int. Cl.
G01R 21/133 (2006.01)
G06F 17/00 (2019.01)

(52) U.S. Cl.
CPC ........... G01R 21/133 (2013.01); G06F 17/00 (2013.01)

(58) Field of Classification Search
CPC .. G01R 19/2513; G01R 21/00; G01R 21/133; G01R 21/1331; G01R 21/1333; G01R 21/1335; G01R 21/1336; G01R 21/1338; G01R 22/00

USPC ................................................ 702/57, 60–61
See application file for complete search history.

(56) References Cited

U.S. PATENT DOCUMENTS

| 7,844,839 B2 * | 11/2010 | Palmer ................ H04L 67/1008 709/201 |
| 8,266,458 B2 * | 9/2012 | Inoue ...................... G06F 9/455 702/60 |
| 2005/0055590 A1 | 3/2005 | Farkas et al. |
| 2008/0065919 A1 | 3/2008 | Hatasaki et al. |

(Continued)

FOREIGN PATENT DOCUMENTS

| CN | 1269112 | 10/2000 |
| CN | 1521991 | 8/2004 |

(Continued)

OTHER PUBLICATIONS

Korean Intellectual Property Office, International Search Report, dated Apr. 28, 2011, 3 pages, Daejeon, Republic of Korea.

Primary Examiner — Manuel L Barbee (57) ABSTRACT

The present disclosure includes a system and method for apportioning power consumption. In an example of apportioning power consumption according to the present disclosure, a transaction mix for a service is determined (104, 204, 330, 420), component resource usage for each of a number of components that are used while completing the service is determined (106, 206, 108, 208, 422), and component power consumption for each of the number of components is determined by use of the component resource usage (334, 424).

19 Claims, 5 Drawing Sheets (56) References Cited

U.S. PATENT DOCUMENTS

| | | |
|---|---|---|
| 2008/0141048 A1 | 6/2008 | Palmer et al. |
| 2009/0006878 A1 | 1/2009 | Borghetti et al. |
| 2009/0292485 A1* | 11/2009 | Van Gorp .............. G01D 4/002 702/57 |
| 2010/0031259 A1 | 2/2010 | Inoue |
| 2010/0179776 A1* | 7/2010 | Van Gorp .......... G01R 19/2513 702/61 |

FOREIGN PATENT DOCUMENTS

| | | |
|---|---|---|
| CN | 101040550 | 9/2007 |
| EP | 2040171 | 3/2009 |

\* cited by examiner

SYSTEMS AND METHODS FOR APPORTIONING POWER CONSUMPTION

BACKGROUND

Energy efficiency is a concern in operating and managing computing services. Energy consumption can affect the operational costs for the computing services and can contribute to the environmental impact of computing services. Power-aware service management solutions require access to power consumption data at the service level The power consumption of a computing service can be a useful tool in devising methods to improve energy efficiency for a computing service.

Deriving power consumption data for computing services can be a challenging task. Computing services, such as customer relationship management and electronic commerce services, can be complex and include many service components running across multiple physical servers. Service components from different services can be co-located on a node and share resources on the node. In particular, virtual server environments can include configurations where components and resources for a computing service are shared among one or more physical servers. Therefore, directly measuring power consumption for a computing service at a service level can be difficult and many times can be impossible.

In some previous approaches, power models have be used to estimate power consumption. The power consumption estimates can use resource usage in the power models, but these estimations can be difficult because resources can be shared by multiple computing services. Some previous approaches have used physical system level power data to estimate power consumption, but these estimates can not be used to determine power consumption at the service level because physical system level power data does not include enough granularity to determine the individual services that contribute the power consumption of the system.

DETAILED DESCRIPTION

The present disclosure includes a system and method for apportioning power consumption. A method for apportioning power consumption can include determining a transaction mix for a service, determining component resource usage for each of a number of components that are used while completing the service, and determining component power consumption for each of the number of components by using the component resource usage. The method can further include determining each transaction type in the service and the request rate for each transaction type, determining power impact factors for each of the number of components used in the service, and determining component resource usage by summing the product of a component's resource demand for each transaction type and the request rate for each transaction type of the transaction mix for the service. Examples of the present disclosure can also include determining power consumption for the service by aggregating component power consumption for each of the number of components.

In the following detailed description of the present disclosure, reference is made to the accompanying drawings that form a part hereof, and in which is shown by way of illustration how examples of the disclosure may be practiced. These examples are described in sufficient detail to enable those of ordinary skill in the art to practice this disclosure, and it is to be understood that other examples may be utilized and that process, electrical, and/or structural changes may be made without departing from the scope of the present disclosure. As used herein, the designators "N," "M," "P,", "R," "S," "T," "U," and "V," particularly with respect to reference numerals in the drawings, indicate that a number of the particular feature so designated can be included with examples of the present disclosure. The designators can represent the same or different numbers of the particular features.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

Figure 1:
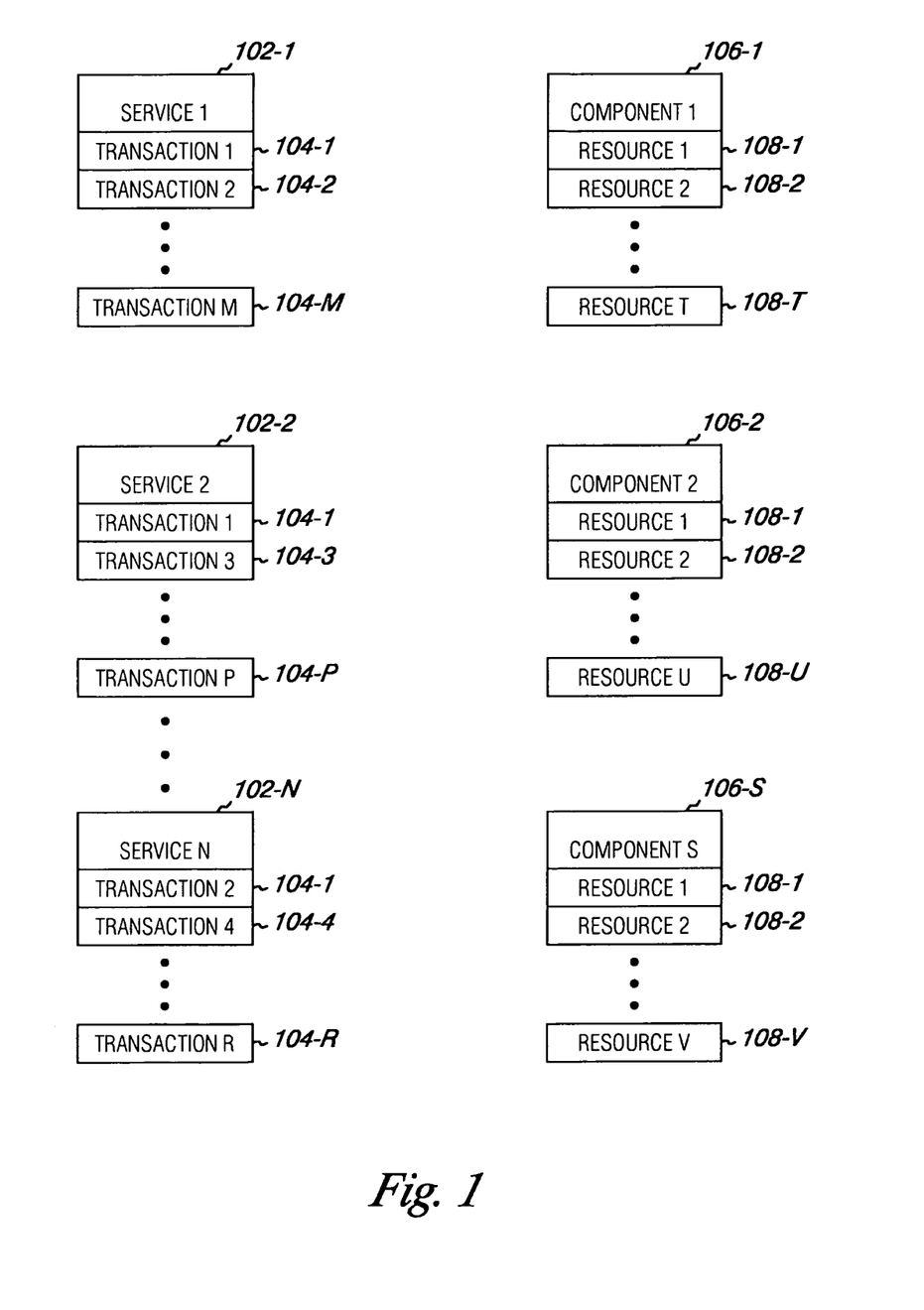
FIG. 1 is a computing operation relationship diagram illustrating business computing services, transactions, components, and resources according to examples of the present disclosure.

FIG. 1 is a computing operation relationship diagram illustrating computing services, transactions, components, and resources according to examples of the present disclosure. In a computing network, services such as logging data, browsing data, and requesting data, among other services, can be requested by a user. These services can be completed by executing a number of transactions using components, such servers, on a computing network. A number of components can be included in a computing device that can have a number of resources. The component resources can be portions of a component that provide for the functional operation of the component. The component resources consume power while executing transactions. Component resources can include a number of processors, a number of network interfaces, a number of input/output (IO) interfaces, hard disk operation, and memory operation, among other component resources. The power consumed during a service by the components while completing the service is a factor that can affect the cost of a service and is desirable to know. The following discussion will be made in the context of a computing service that uses servers and computing devices to execute the service. However, examples of the present disclosure are not limited to these examples, and the system and method of the present disclosure may be implemented in many other configurations, and applied to many other services that use power consuming components.

in FIG. 1, computing operations can include a number of services 102-1, . . . , 102-N. The services 102-1, . . . , 102-N can include logging data, browsing data, and requesting data, among other services. The services 102-1, . . . 102-N can include a number of transactions 104-1, 104-M, 104-P, . . . , 104-R. The transactions 104-1, 104-M, 104-P, . . . 104-R can include operations that are performed by components on a network to execute a service 102-1, . . . 102-N. A service can include any number of types of transactions and any number of each type of transaction. The type of the transaction and the number of each transaction type and/or rate of each transaction type that make up a service can be referred to as the transaction mix for a service.

In FIG. 1, the transaction mix for service 1 102-1 includes transaction 1 104-1, transaction 2 104-2, and transaction M 104-M. The transaction mix for service 2 102-1 includes transaction 1 104-1, transaction 3 104-3, and transaction P 104-P. The transaction mix for service N 102-N includes transaction 2 104-2, transaction 4 104-4, and transaction R 104-R. Each of the transactions types, transaction 1 104-1, transaction 2 104-2, transaction 3 104-3, transaction 4 104-4, transaction M 104-M, transaction P 104-P, and transaction R 104-R, for each of the services, service 1 104-1, service 2 102-2, and service N 104-N, include a transaction rate for the transaction type of a given service. The transaction mix, which includes the transaction rate for each transaction type of a service, for each service can be used to calculate the component resource usage for the components used while completing a service.

A service is completed by executing the transaction mix for the service on a number of components. The components can be servers on a network, such as a web server, an application server, a database server, and/or a computer. In FIG. 1, a number of components, component 1 106-1, component 2 106-2, and component S 106-S, are illustrated. Each of the number of components include a number of resources, such as a processor, a network interface, an IO interface, hard disk operation, and memory operation, among other component resources. A component's resource can be shared among a number of computing devices. In FIG. 1, component 1 106-1 includes resource 1 108-1, resource 2 108-2, and resource T 108-T. The resources for component 2 106-1 include resource 1 108-1, resource 2 108-2, and resource U 108-U. The resources for component S 106-S include resource 1 108-1, resource 2 108-2, and resource V 108-V. Each component can include a number of resources that may or may not be used while executing a transaction of a service. A service's resource usage is the sum of its transactions' resource usage. A service's power usage is the sum of its transactions' power usage. Transaction resource usage and power usage cannot always be measured directly, but may be estimated using the method described below.

Figure 2:
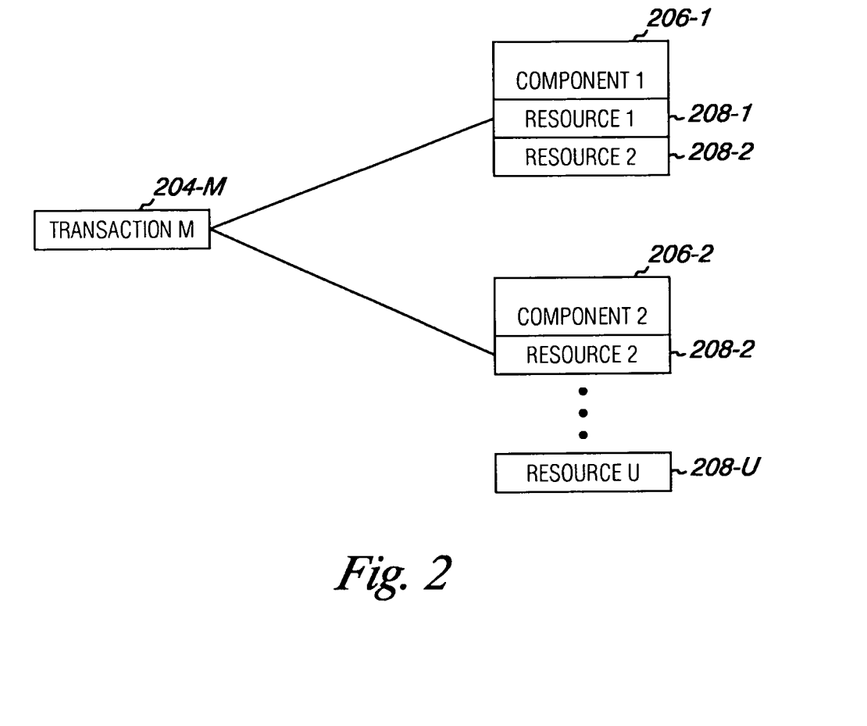
FIG. 2 is a computing operation relationship diagram illustrating components and resources in a computing transaction according to examples of the present disclosure.

FIG. 2 is a computing operation relationship diagram illustrating components and resources in a computing transaction according to examples of the present disclosure. In FIG. 2, transaction M 204-M includes using component 1 206-1 and component 2 206-2 to execute transaction M 204-M. In some examples, component 1 206-1 could be a web server, component 2 206-2 could be a database server, and transaction M 204-M could be a data request for a browsing data service request from a user.

When transaction M 204-M is executed by component 1 206-1 and component 2 206-2, a number of component resources are used. Component 1 206-1 uses resource 1 208-1 and resource 2 208-2 and component 2 206-2 uses resource 2 208-2 and resource U 208-U. The rate at which the resources are used during execution of a transaction and the demand of each resource can be used to determine the component resource usage for the components that are used while executing a service. The component resource usage for a service measures the amount that a component resource is used during completion of a service.

Figure 3:
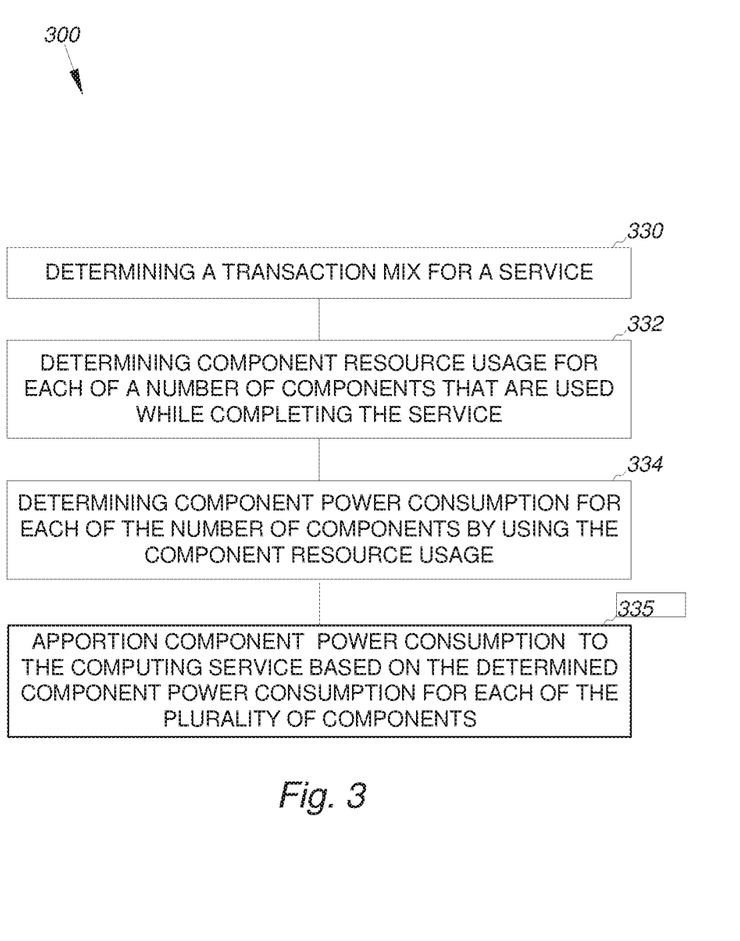
FIG. 3 is a method flow diagram illustrating apportioning power consumption of a number of components to a computing service according to examples of the present disclosure.

FIG. 3 is a method flow diagram illustrating apportioning the power consumption of a number of component's resources to a computing service according to examples of the present disclosure. A computing service can use a number of components that include a number of resources that consume power. FIG. 3 illustrates a method for apportioning the power consumption of the component's resources that were used in completing the service to the service. In FIG. 3, apportioning power consumption 300 includes determining a transaction mix for a service 330, determining component resource usage for each of a number of components that are used while completing the service 332, determining component power consumption for each of the number of components by using the component resource usage 334, and apportioning the component power consumption to the computing service based on the determined component power consumption for each of the plurality of components.

Apportioning the power consumption of a number of component's resources to a computing service can further include determining each transaction type in the service and the request rate for each transaction type, determining power impact factors for each of the number of components used in the service, and determining component resource usage by summing the product of a component's resource demand for each transaction type and the request rate for each transaction type of the transaction mix for the service. Examples of the present disclosure can also include determining power consumption for the service by aggregating component power consumption for each of the number of components.

Figure 4:
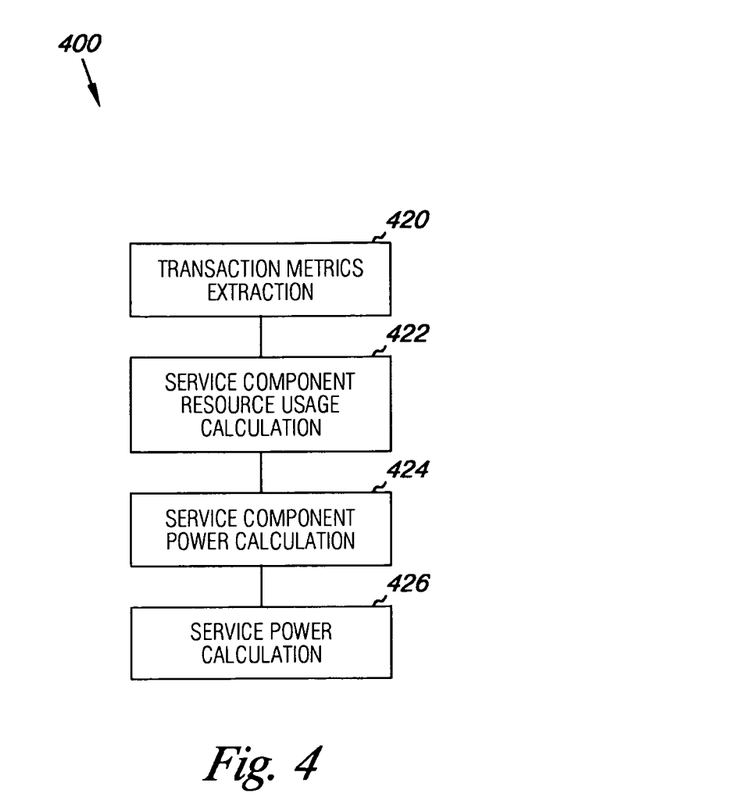
FIG. 4 is a block diagram illustrating determining power consumption of a computing service 400 according to examples of the present disclosure.

FIG. 4 is a block diagram illustrating determining power consumption of a computing service 400 according to examples of the present disclosure. In FIG. 4, determining power consumption of a computing service 400 includes transaction metrics extraction 420. Transaction metric extraction 420 includes determining the transaction mix for a service. Transaction metrics for a service can include the types of transactions that are part of the service and the rate at which each transaction type is requested and/or completed. As discussed above, the transaction mix includes the type of the transactions ($\lambda_1, \lambda_2, \ldots, \lambda_N$), where N is the number of unique transaction types and $\lambda_1$ is the rate of each transaction type that make up a service. The transaction metrics can be extracted from monitoring data on a network. Transaction metrics for a service can include the types of transactions that are part of the service and the rate at which each transaction type is requested.

In examples of the present disclosure, if the transaction types for a service are not given in the transaction metrics, a classifier can be constructed to map the transactions based on the resource demand for each transaction of a service. In examples the present disclosure, the transaction metrics for the most popular transactions can be used to create the transaction mix. In some examples, the top 50 transaction types and rates may be used to create the transaction mix because they may account for some portion, e.g., 98%, of the resource demand for a component when completing a service, which provides a significant sample of the resource demand for a component allowing for a meaningful calculation of the component resource usage.

In FIG. 4, determining power consumption of a computing service 400 includes service component resource usage calculation 422. The resource demands of different transaction types are usually different, but the resource demands of a single transaction type is relatively fixed irrespective of the transaction mix of the workload, since each transaction type usually has a relatively fixed code execution path. The service component resource usage calculation 422 uses the transaction mix that was created by the transaction metrics extraction 420. The component resource usage ($U_c$) for each component used during a service is calculated by summing the product of the transaction rate for each transaction type and the resource demand for each transaction type ($\alpha_i$) and adding the background resource usage ($U_{c,0}$) to the sum. The background resource usage is the resource usage when there are no transactions being executed. The component resource usage ($U_c$) for a component c can be defined by the following equation:

$$U_c = \sum_{i=1}^{N} \alpha_i \cdot \lambda_i + U_{c,0}$$

The resource demand for each transaction type ($\alpha_i$) and the background resource usage ($U_{c,0}$) can be calculated by linear regression from a number of measurements of transaction mix and its corresponding measured $U_c$. The measurements may include the resource usage of the component when no transactions are being executed.

In examples of the present disclosure, an aggregate resource usage model for a service can be created by summing the component resource usage calculation for each component and adding the background load on the node that each component is coupled to in a network.

The resource usage for each component used during a service may be relatively static across different transaction mixes and may be independent of other service components on the same server. The resource usage calculation for a component can be recalibrated based on measured transaction mix and estimates for $\alpha_i$ and $U_{c,0}$ if there are non-stationary changes to the workload on the component. Data can be gathered for the changed transaction mix and resource demand operations and used to periodically recalculate the component resource demand for a service and background resource usage.

In examples of the present disclosure, a component resource usage can be calculated by adding the background resource usage ($U_{c,0}$) for a component to the product of an aggregate transaction rate for a component and an aggregate resource demand for a component. This component resource usage calculation can be used when the transaction mix for a service is not known or when the transaction mix is relatively stationary for a service.

In FIG. 4, determining power consumption of a computing service 400 includes service component power calculation 424. The service component power ($P_c$) calculation 424 uses the service component resource usage ($U_c$) calculation and power impact factors for each component. Power impact factors $\rho$, $\beta$, $\gamma$, and $\Theta$ for each component resource can be calculated by linear regression of data that includes power data for each of the resources. Component resources can include a processor, a network input/output (IO) interface, hard disk operation, and memory operation, among other component resources. The service component power consumption ($P_c$) for each component used during a service can be calculated by summing the product of the component resource usage ($U_c$) and the power impact factor for each resource and adding the background power consumption ($P_b$) to the sum. The background power consumption ($P_b$) is the power consumption when none of the resources are being used to execute a transaction. The background power consumption can be calculated by linear regression of measurements of the power consumed by each resource when no transactions are being executed. In examples of the present disclosure, the power impact factors can be updated at periodic intervals by measuring the power consumption in real time. The service component power consumption ($P_c$) for each component used during a service can be can be defined by the following equation:

$$P_c = P_b + \rho \cdot U_{c1} + \beta \cdot U_{c2} + \gamma \cdot U_{c3} \theta \cdot U_{c4}$$

where $\rho$, $\beta$, $\gamma$, and $\Theta$ are power impact factors for a processor, memory, disk IO, and network IO, respectively, and $U_{c1}$, $U_{c2}$, $U_{c3}$, and $U_{c4}$ are processor usage, memory usage, disk IO usage, and network IO usage, respectively. In some examples, the quantity of memory used may be included in the baseline power consumption $P_b$, In other examples, the quantity of memory used may be expressed as another term used to compute $P_c$.

In examples of the present disclosure, the processor resource is the major power consumer for a component and using just the processor power consumption in the service component power calculation 424 provides an accurate model of the power consumed by a component during a service. In examples of the present disclosure, a number of components can be on a node. Therefore, a node with a number of components can be used to complete a number of services, some even simultaneously. The background power consumption for the node, which includes a number of components, can be apportioned among the components that share the node. One method to apportion the background power consumption is to assign the same proportion of component resource usage to resource usage of the node to the background power consumption for a component. Another method to apportion the background power consumption is to assign the background power consumption for a component as the component resource usage multiplied by the background power consumption for the node and add that to the product of the remaining, i.e., unaccounted for, background power consumption for the node multiplied by the ratio of the difference between peak and average resource usage for the component and the sum of the difference between peak and average resource usage for all the components on the node. The peak resource usage is the 100-percentile of resource usage for a component. in other examples, another percentile, such as the 95-percentile of resource usage could also be used in the same manner.

in FIG. 4, apportioning power consumption includes service power calculation 426. Service power calculation 426 includes summing the service component power calculation 424 for each component of the service. The service configuration can be used to determine the components that are used in completing a service.

In examples of the present disclosure, the power consumption for service can be calculated by determining the transaction mix for a service, using the transaction mix to determine the component resource usage for a service, using the component resource usage for a service to determine the component power consumption for a service, and summing power consumption for each component used in a service.

The examples of the present disclosure can quantify the power consumption of a service while taking into account that services can have an impact on a components power consumption that is greater than just the power increase through direct resource demand of the service components used in a service.

Examples of the present disclosure can also provide a process model for a service that includes component resource usage models, component power consumption models, monitoring data, and service configuration data to obtain the service power consumption.

Figure 5:
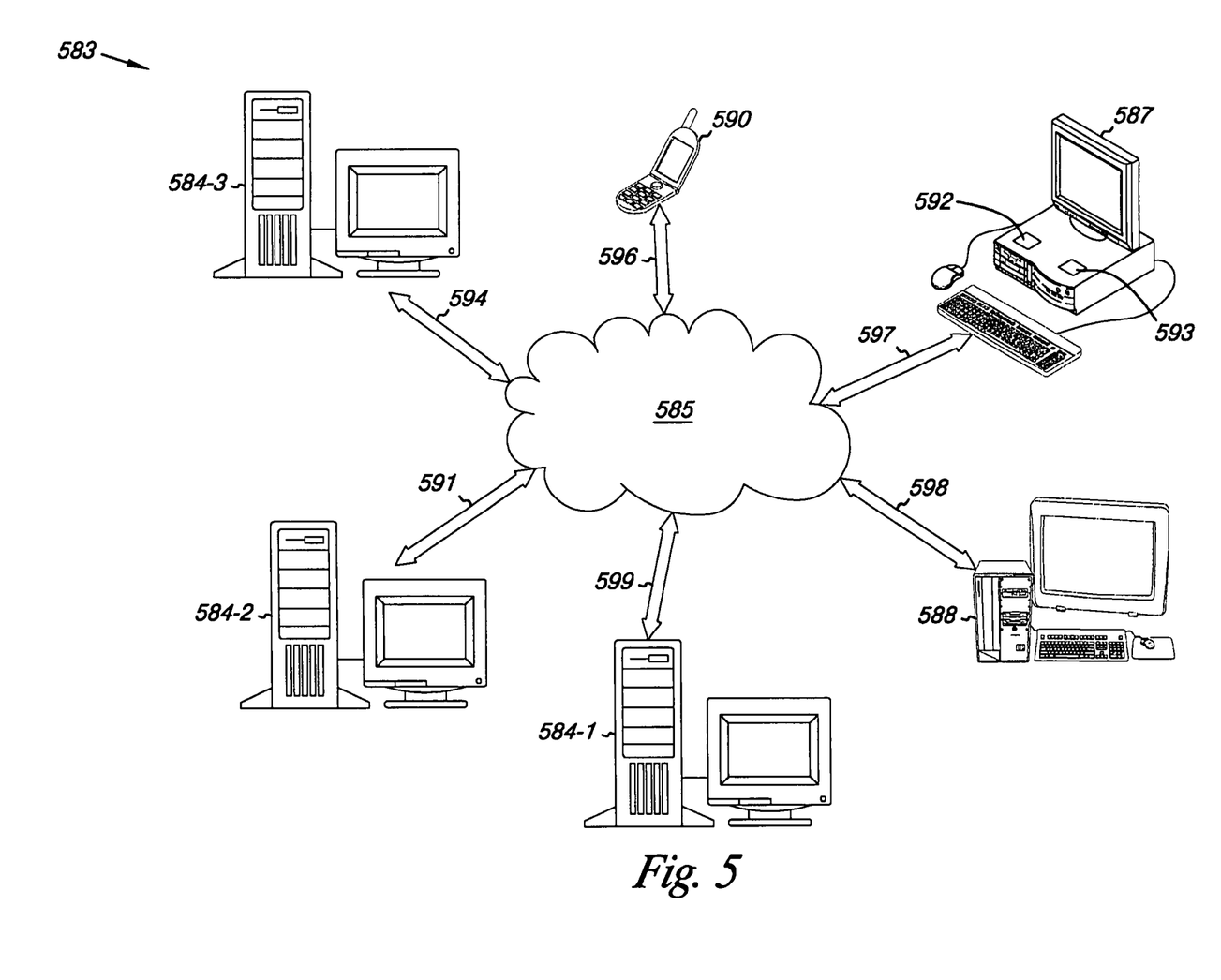
FIG. 5 is a computing network system according to examples of the present disclosure.

FIG. 5 is a computing network system 583 according to examples of the present disclosure. The computing network system 583 can include a communication network 585 having a number of electronic devices communicatively coupled thereto. As shown in FIG. 5, communication network 585 can have a first mobile device 590, a first user device 587, a second user device 588, a first server 584-1, a second server 584-2, and a third server 584-3 communicatively coupled to network 585. Each system component can be coupled to network 585 by a wired or wireless communication channel. In FIG. 5, the first mobile device 590 is shown being coupled to the network 585 by a first communication channel 596; first user device 587 is shown being coupled to the network 585 by a second communication channel 597; second user device 588 is shown being coupled to the network 585 by a third communication channel 598; first server 584-1 is shown being coupled to the network 585 by a fourth communication channel 599; second server 584-2 is shown being coupled to the network 585 by a fifth communication channel 591; and third server 584-3 is shown being coupled to the network 585 by a sixth communication channel 594.

Not all of the components and/or communication channels illustrated in FIG. 5 are required to practice the system and method of the present disclosure, and variations in the arrangement, type, and quantities of the components may be made without departing from the spirit or scope of the system and method of the present disclosure. Other computing network system components can include personal computers, laptop computers, mobile devices, cellular telephones, personal digital assistants, video game consoles, or the like. Communication channels may be similar to, or different from, other communication channels.

Generally, mobile device 590, and first and second user devices 587 and 588, and first, second, and third servers 584-1, 584-2, and 584-3 may include virtually any computing device capable of connecting to another computing device to send and receive information, including web requests for information from a server device, and the like.

Mobile device 590 and the first and second user devices 587 and 588 may further include a client application to manage various actions, for example, a web browser application to enable an end-user to interact with one or more servers (e.g., server 584) and/or other devices and/or applications via network 585.

Servers 584-1, 584-2, and 584-3 may include a server application to manage various actions, for example, a web-server application to enable an end-user to interact with servers 584-1, 584-2, and 584-3 via network 585. In examples of the present disclosure, mobile device 590, first and second user devices 587 and 588, and servers 584-1, 584-2, and 584-3 may complete a computing service by executing the transactions that make up a service. In FIG. 5, first user device 587 includes a processor 592 and a non-transitory computer readable medium 593 for executing instructions. Mobile device 590, first and second user devices 587 and 588, and servers 584-1, 584-2, and 584-3 can include a number of processors and non-transitory computer-readable media (e.g., memory) that store instructions executable by the number of processors. That is, the executable instructions can be stored in a fixed tangible medium communicatively coupled to the one or more processors. Memory can include RAM, ROM, and/or mass storage devices, such as a hard disk drive, tape drive, optical drive, solid state drive, and/or floppy disk drive.

The non-transitory computer-readable media can be programmed with instructions such as an operating system for controlling the operation of servers 584-1, 584-2, and 584-3, and/or computing services such as logging data, browsing data, and requesting data, among other services. The operating system and/or applications may be implemented as one or more executable instructions stored at one or more locations within volatile and/or non-volatile memory. Servers 584-1, 584-2, and 584-3 may also include an internal or external database, or other archive medium for storing, retrieving, organizing, and otherwise managing computing services.

Mobile device 590 can also be a user device and include a processor in communication with a non-transitory memory, a power supply, a number of network interfaces, an audio interface, a video interface, a display, a keyboard and/or keypad, and an optional global positioning systems (GPS) receiver. Mobile device 590 may optionally communicate with a base station (not shown), or directly with another network component device. Network interfaces include circuitry for coupling the mobile device to a number of networks, and is constructed for use with a number of communication protocols and technologies including, but not limited to, e-mail, Internet, and/or wireless communication protocols. The network interface is sometimes known as a transceiver, transceiving device, or network interface card (NIC).

Applications on client devices may include computer executable instructions stored in a non-transient medium which, when executed by a processor, provide functions, such as a web browser, to enable interaction with other computing devices such as a server, and/or the like.

In some examples, the above discussed computing network system can be used, controlled, and/or the like through a web browser by a user. In some examples, the web browser can communicate with a web server running server-side computing applications to perform computing services.

The above specification, examples and data provide a description of the method and applications, and use of the system and method of the present disclosure. Since many examples can be made without departing from the spirit and scope of the system and method of the present disclosure, this specification merely sets forth some of the many possible configurations and implementations.

Although specific examples have been illustrated and described herein, those of ordinary skill in the art will appreciate that an arrangement calculated to achieve the same results can be substituted for the specific examples shown. This disclosure is intended to cover adaptations or variations of a number of examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the number of examples of the present disclosure includes other applications in which the above structures and methods are used. Therefore, the scope of number of examples of the present disclosure should be determined with reference to the appended claims, along with the full range of equivalents to which such claims are entitled.

Various examples of the system and method for apportioning power consumption have been described in detail with reference to the drawings, where like reference numerals represent like parts and assemblies throughout the several views. Reference to various examples does not limit the scope of the system and method for displaying advertisements, which is limited only by the scope of the claims attached hereto. Additionally, any examples set forth in this specification are not intended to be limiting and merely set forth some of the many possible examples for the claimed system and method for apportioning power consumption.

Throughout the specification and claims, the meanings identified below do not necessarily limit the terms, but merely provide illustrative examples for the terms. The meaning of "a," "an," and "the" includes plural reference, and the meaning of "in" includes "in" and "on." The phrase "in an example," as used herein does not necessarily refer to the same example, although it may.

In the foregoing Detailed Description, some features are grouped together in a single example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a single disclosed example. Thus, the following claims are hereby incorporated into the Detailed Description, with each claim standing on its own as a separate example.

What is claimed:

1. A method for apportioning power consumption, the method implemented by a physical processor implementing machine readable instructions, the method comprising:
   determining, by the processor, a plurality of transactions that are used to complete a computing service;
   determining, by the processor, a plurality of components that are used to execute operations included in each transaction of the plurality of transactions, wherein each component of the plurality of components comprises a plurality of resources that consume power while executing each transaction of the plurality of transactions;
   determining, by the processor, a component resource usage for each component of the plurality of components based on resource demand by the plurality of resources;
   determining, by the processor, a component power consumption for each component of the plurality of components based on the component resource usage for each component of the plurality of components; and
   apportioning, by the processor, the component power consumption to the computing service based on the determined component power consumption for each component of the plurality of components.

2. The method of claim 1, further comprising:
   determining, by the processor, a transaction mix for the computing service, wherein the transaction mix includes a plurality of transaction types and a request rate at which each transaction type of the plurality of transactions types is requested; and
   determining, by the physical processor, the component resource usage for each component of plurality of components based on the resource demand by the plurality of resources and the determined transaction mix.

3. The method of claim 2, wherein each transaction of the plurality of transactions belongs to a particular transaction type among the plurality of transaction types in the transaction mix.

4. The method of claim 3, wherein determining the component resource usage for each component of the plurality of components includes determining, by the processor, a product of a resource demand for each transaction type of the plurality of transaction types and the request rate for each transaction type of the plurality of transaction types.

5. The method of claim 1, wherein determining the component power consumption for each component of the plurality of components includes determining, by the processor, power impact factors for each component of the plurality of components.

6. The method of claim 1, wherein determining the component resource usage for each component of the plurality of components includes determining, by the processor, background resource usage for each component of the plurality of components, wherein the background resource usage represents a resource usage when no transactions are executed.

7. The method of claim 1, wherein determining the component power consumption for each component of the plurality of components includes determining, by the processor, background power consumption for each component of the plurality of components, wherein the background power consumption represents a power consumption when no transactions are executed.

8. The method of claim 1, wherein each resource of the plurality of resources represents a processor, a network interface, an I/O interface, a hard disk operation, or a memory operation.

9. The method of claim 1, further comprising:
   constructing, by the physical processor, a classifier that maps the plurality of transactions based on a resource demand for each transaction of the plurality of transactions.

10. A non-transitory computer readable medium having machine readable instructions stored thereon executable by a physical processor to:
   determine a plurality of transactions that are used to complete a computing service;
   determining a plurality of components that are used to execute operations included in each transaction of the plurality of transactions, wherein each component of the plurality of components represents a virtual or physical computing device, and each component of the plurality of components comprises a plurality of resources that consume power while executing each transaction of the plurality of transactions;
   determine component resource usage for each component of the plurality of components based on resource demand by the plurality of resources;
   determine component power consumption for each component of the plurality of components by using the component resource usage; and
   apportion the component power consumption to the computing service based on the determined power consumption for each component of the plurality of components.

11. The non-transitory computer readable medium of claim 10, wherein the computing service includes a computing service of logging data, browsing data, or adding data.

12. The non-transitory computer readable medium of claim 10, wherein each component of the plurality of components includes one of a web server, an application server, or a database server.

13. The non-transitory computer readable medium of claim 10, the non-transitory computer readable medium having the instructions stored thereon executable by the processor to:
   determine a transaction mix for the computing service, wherein the transaction mix includes a plurality of transaction types in the computing service and a request rate for each transaction type of the plurality of transaction types; and
   determine the component resource usage for each component of the plurality of components based on the resource demand by the plurality of resources and the determined transaction mix.

14. The non-transitory computer readable medium of claim 13, the non-transitory computer readable medium having the instructions stored thereon executable by the processor to:
   determine a resource demand of each transaction type of the plurality of transaction types based on a linear regression of data that includes the resource demand by the plurality of resources for each component of the plurality of components.

15. The non-transitory computer readable medium of claim 14, the non-transitory computer readable medium having the instructions stored thereon executable by the processor to:
   determine the component resource usage for each component of the plurality of components by determining a sum of a product of the resource demand of each transaction type of the plurality of transaction types and the request rate for each transaction type of plurality of transaction types.

16. The non-transitory computer readable medium of claim 10, the non-transitory computer readable medium having the instructions stored thereon executable by the processor to:
   determine the component power consumption for each component of the plurality of components includes determining power impact factors for each component of the plurality of components.

17. A power consumption apportioning system, comprising:
   a plurality of communicatively coupled user computing devices; and
   at least one server computing device communicatively coupled to the plurality of communicatively coupled user computing devices, the server computing device comprising:
      at least one physical processor;
      a non-transitory memory in communication with the at least one physical processor, the non-transitory memory being programmed with instructions executable on the at least one physical processor to:
      determine a transaction mix that comprises a plurality of transaction types for a computing service and a request rate at which each transaction type of the plurality of transaction types is requested;
      determine a plurality of transactions that are used to complete the computing service;
      determine a plurality of components that are used to execute operations included in each of the plurality of transactions, wherein each component of the plurality of components comprises a plurality of resources that consume power while executing each transaction of the plurality of transactions;
      determine component resource usage for each component of the plurality of components based on at least one of: (i) the request rate for each transaction type of the plurality of transaction types, and (ii) resource demand that is made by the plurality of resources to execute each transaction of the plurality of transactions, wherein each transaction of the plurality of transactions corresponds to a particular transaction type among the plurality of transaction types;
      determine component power consumption for each component of the plurality of components by using the component resource usage; and
      apportion the component power consumption to the computing service based on the determined component power consumption for each component of the plurality of components.

18. The power consumption apportioning system of claim 17, wherein the non-transitory memory is programmed with instructions executable on at least one physical the processor to:
   determine the transaction mix for the computing service, wherein the transaction mix includes the plurality of transaction types and a request rate at which each transaction type of the plurality of transactions types is requested; and
   determine the component resource usage for each component of plurality of components based on the resource demand by the plurality of resources and the determined transaction mix.

19. The power consumption apportioning system of claim 17, wherein determining the component power consumption for each component of the plurality of components includes determining power impact factors for each component of the plurality of components.

* * * * *